United States Patent
Fischer et al.

(10) Patent No.: US 12,429,363 B2
(45) Date of Patent: Sep. 30, 2025

(54) SYSTEM AND METHOD FOR ARBITRARY OPTICAL WAVEFORM GENERATION

(71) Applicant: INSTITUT NATIONAL DE LA RECHERCHE SCIENTIFIQUE, Quebec (CA)

(72) Inventors: Bennet Fischer, Montreal (CA); Mario Chemnitz, Montreal (CA); Benjamin Maclellan, Stirling (CA); Piotr Roztocki, Longueuil (CA); José Azaña, Montreal (CA); Yoann Jestin, Montreal (CA); Roberto Morandotti, Montreal (CA)

(73) Assignee: INSTITUT NATIONAL DE LA RECHERCHE SCIENTIFIQUE, Québec (CA)

( * ) Notice: Subject to any disclaimer, the term of this patent is extended or adjusted under 35 U.S.C. 154(b) by 693 days.

(21) Appl. No.: 17/660,115

(22) Filed: Apr. 21, 2022

(65) Prior Publication Data
US 2022/0341760 A1    Oct. 27, 2022

Related U.S. Application Data

(60) Provisional application No. 63/201,378, filed on Apr. 27, 2021.

(51) Int. Cl.
*G01D 5/26* (2006.01)
*G01D 5/353* (2006.01)
(Continued)

(52) U.S. Cl.
CPC ............. *G01D 5/266* (2013.01); *G01D 5/268* (2013.01); *G01D 5/35329* (2013.01); *G01D 5/366* (2013.01); *G06N 3/126* (2013.01)

(58) Field of Classification Search
None
See application file for complete search history.

(56) References Cited

U.S. PATENT DOCUMENTS

| | | | |
|---|---|---|---|
| 7,177,027 B2 | 2/2007 | Hirasawa et al. | |
| 8,208,504 B2 | 6/2012 | Dantus et al. | |
| (Continued) | | | |

FOREIGN PATENT DOCUMENTS

EP    2572412    8/2016

OTHER PUBLICATIONS

N. Amaya, R. Nejabati, G. Zarris, D. K. Hunter, and D. Simeonidou, "Adaptive pulse shaping for high-speed optical communications," Opt. InfoBase Conf. Pap. 1-3 (2010).
(Continued)

*Primary Examiner* — Chad H Smith
(74) *Attorney, Agent, or Firm* — Gwendoline Bruneau; Lavery, de Billy, L.L.P.

(57) ABSTRACT

A method and a system for arbitrary optical waveform generation from an optical input, the system comprising an optical shaper comprising unbalanced interferometers with at least one delay, the delay being selected of at least 0.1 ps, an optical sampling readout selected for measuring optical waveforms of at least 0.1 ps; and an electronic processing unit; wherein the optical input is a picosecond pulse; with a minimal pulse duration before the optical shaper equal to a minimal delay of the optical shaper; the optical shaper splitting and interfering optical pulses; the optical sampling readout collecting data at an output of the optical shaper; and the electronic processing unit comparing the collected data with a preset target and updating the optical shaper from results of the comparison until a maximal match between the output of the optical shaper and the preset target output, wherein the maximal match is determined iteratively using (Continued)

one of: machine-learning, optimization algorithms and iterative search algorithms.

9 Claims, 7 Drawing Sheets

(51) Int. Cl.
 *G01D 5/36* (2006.01)
 *G06N 3/126* (2023.01)

(56) References Cited

U.S. PATENT DOCUMENTS

| | | | |
|---|---|---|---|
| 8,526,473 B2* | 9/2013 | Baird | H01S 3/102 438/130 |
| 2004/0089804 A1* | 5/2004 | Dantus | H01J 49/164 250/423 P |
| 2020/0373726 A1* | 11/2020 | Wetzel | G02F 1/35 |

OTHER PUBLICATIONS

U. Andral, R. Si Fodil, F. Amrani, F. Billard, E. Hertz, and P. Grelu, "Fiber laser mode locked through an evolutionary algorithm," Optica 2, 275 (2015).
L. Antonucci, X. Solinas, A. Bonvalet, and M. Joffre, "Asynchronous optical sampling with arbitrary detuning between laser repetition rates," Opt. Express 20, 17928 (2012).
T. Baumert, T. Brixner, V. Seyfried, M. Strehle, and G. Gerber, "Femtosecond pulse shaping by an evolutionary algorithm with feedback," Appl. Phys. B Lasers Opt. 65, 779-782 (1997).
S. Boscolo and C. Finot, "Artificial neural networks for nonlinear pulse shaping in optical fibers," Opt. Laser Technol. 131, 106439 (2020).
M. Chemnitz, M. Baumgartl, T. Meyer, C. Jauregui, B. Dietzek, J. Popp, J. Limpert, and A. Tunnermann, "Widely tuneable fiber optical parametric amplifier for coherent anti-Stokes Raman scattering microscopy," Opt. Express 20, 26583 (2012).
S. Chen and J. Montgomery, "Particle swarm optimization with thresheld convergence," in 2013 IEEE Congress on Evolutionary Computation (IEEE, 2013), pp. 510-516.
A. M. Clarke, D. G. Williams, M. A. F. Roelens, and B. J. Eggleton, "Reconfigurable optical pulse generator employing a fourier-domain programmable optical processor," J. Light. Technol. 28, 97-103 (2010).
M. Clerc and J. Kennedy, "The particle swarm-explosion, stability, and convergence in a multidimensional complex space," IEEE Trans. Evol. Comput. 6, 58-73 (2002).
P. J. Delfyett, D. Mandridis, M. U. Piracha, D. Nguyen, K. Kim, and S. Lee, "Chirped pulse laser sources and applications," Prog. Quantum Electron. 36, 475-540 (2012).
R. C. Eberhart and Y. Shi, "Comparison between genetic algorithms and particle swarm optimization," in Evolutionary Programming VII. EP 1998. Lecture Notes in Computer Science, V. W. Porto, N. Saravanan, D. Waagen, and A. E. Eiben, eds. (Springer Berlin Heidelberg, 1998), vol. 1447, pp. 611-616.
M. Y.-S. Fang, S. Manipatruni, C. Wierzynski, A. Khosrowshahi, and M. R. DeWeese, "Design of optical neural networks with component imprecisions," Opt. Express 27, 14009 (2019).
Q. Feng, B. Zhang, Z. Liu, C. Lin, and Y. Ding, "Research on intelligent algorithms for amplitude optimization of wavefront shaping," Appl. Opt. 56, 3240 (2017).
S. Feng, C. Qin, K. Shang, S. Pathak, W. Lai, B. Guan, M. Clements, T. Su, G. Liu, H. Lu, R. P. Scott, and S. J. Ben Yoo, "Rapidly reconfigurable high-fidelity optical arbitrary waveform generation in heterogeneous photonic integrated circuits," Opt. Express 25, 8872 (2017).
C. Finot, S. Pitois, and G. Millot, "Regenerative 40 Gbit/s wavelength converter based on similariton generation," Opt. Lett. 30, 1776 (2005).
J. A. Fülöp, Z. Major, B. Horváth, F. Tavella, A. Baltuška, and F. Krausz, "Shaping of picosecond pulses for pumping optical parametric amplification," Appl. Phys. B 87, 79-84 (2007).
G. Furuhata, T. Niiyama, and S. Sunada, "Physical Deep Learning Based on Optimal Control of Dynamical Systems," Phys. Rev. Appl. 15, 034092 (2021).
Y. Gao, A. Wen, H. Zheng, D. Liang, and L. Lin, "Photonic microwave waveform generation based on phase modulation and tunable dispersion," Opt. Express 24, 12524 (2016).
G. Genty, L. Salmela, J. M. Dudley, D. Brunner, A. Kokhanovskiy, S. Kobtsev, and S. K. Turitsyn, "Machine learning and applications in ultrafast photonics," Nat. Photonics 15, 91-101 (2021).
J. Girardot, F. Billard, A. Coillet, É. Hertz, and P. Grelu, "Autosetting Mode-Locked Laser Using an Evolutionary Algorithm and Time-Stretch Spectral Characterization," IEEE J. Sel. Top. Quantum Electron. 26, (2020).
D. Guo, L. Yin, and G. Yuan, "New automatic optical design method based on combination of particle swarm optimization and least squares," Opt. Express 27, 17027 (2019).
R. Hassan, B. Cohanim, O. de Weck, and G. Venter, "A Comparison of Particle Swarm Optimization and the Genetic Algorithm," in 46th AIAA/ASME/ASCE/AHS/ASC Structures, Structural Dynamics and Materials Conference (American Institute of Aeronautics and Astronautics, 2005).
N. B. Hébert, S. Boudreau, J. Genest, and J.-D. Deschênes, "Coherent dual-comb interferometry with quasi-integer-ratio repetition rates," Opt. Express 22, 29152 (2014).
E. M. T. Hendrix and A. Lančinskas, "On Benchmarking Stochastic Global Optimization Algorithms," Inform. 26, 649-662 (2015).
J. P. Heritage, A. M. Weiner, and R. N. Thurston, "Picosecond pulse shaping by spectral phase and amplitude manipulation," Opt. Lett. 10, 609 (1985).
J. Huh and J. Azaña, "Generation of high-quality parabolic pulses with optimized duration and energy by use of dispersive frequency-to-time mapping," Opt. Express 23, 27751 (2015).
J. Huh and J. Azaña, "In-fiber reconfigurable generation of arbitrary (asymmetric) picosecond temporal intensity waveforms by time-domain optical pulse shaping," Opt. Lett. 41, 693 (2016).
J. Kennedy and R. Eberhart, "Particle swarm optimization," in Proceedings of ICNN'95—International Conference on Neural Networks (IEEE, 1995), pp. 1942-1948.
M. H. Khan, H. Shen, Y. Xuan, L. Zhao, S. Xiao, D. E. Leaird, A. M. Weiner, and M. Qi, "Ultrabroad-bandwidth arbitrary radiofrequency waveform generation with a silicon photonic chip-based spectral shaper," Nat. Photonics 4, 117-122 (2010).
A. I. Latkin, S. Boscolo, R. S. Bhamber, and S. K. Turitsyn, "Doubling of optical signals using triangular pulses," J. Opt. Soc. Am. B 26, 1492 (2009).
S. Liao, S. Min, and J. Dong, "On-chip optical pulse shaper for arbitrary waveform generation using optical gradient force," Eur. Conf. Opt. Commun. ECOC 5-7 (2014).
S. Liao, Y. Ding, J. Dong, T. Yang, X. Chen, D. Gao, and X. Zhang, "Arbitrary waveform generator and differentiator employing an integrated optical pulse shaper," Opt. Express 23, 12161 (2015).
S. Liao, Y. Ding, J. Dong, S. Yan, X. Wang, and X. Zhang, "Photonic arbitrary waveform generator based on Taylor synthesis method," Opt. Express 24, 24390 (2016).
C. Liu, Y. Sun, L. Zhao, S. Zhang, M. M. T. Loy, and S. Du, "Efficiently Loading a Single Photon into a Single-Sided Fabry-Perot Cavity," Phys. Rev. Lett. 113, 133601 (2014).
F. Liu, S. Huang, S. Si, G. Zhao, K. Liu, and S. Zhang, "Generation of picosecond pulses with variable temporal profiles and linear polarization by coherent pulse stacking in a birefringent crystal shaper," Opt. Express 27, 1467 (2019).
Y. Ma, X. Huang, X. Wang, L. Ji, Y. He, L. Qiu, J. Zhao, Y. Wang, and S. Wu, "Precise pulse shaping for quantum control of strong optical transitions," Opt. Express 28, 17171 (2020).
A. Malinowski, K. T. Vu, K. K. Chen, J. Nilsson, Y. Jeong, S. Alam, D. Lin, and D. J. Richardson, "High power pulsed fiber MOPA system incorporating electro-optic modulator based adaptive pulse shaping," Opt. Express 17, 20927 (2009).
D. Meshulach, D. Yelin, and Y. Silberberg, "Adaptive real-time femtosecond pulse shaping," J. Opt. Soc. Am. B 15, 1615 (1998).

(56) References Cited

OTHER PUBLICATIONS

L. Michaeli and A. Bahabad, "Genetic algorithm driven spectral shaping of supercontinuum radiation in a photonic crystal fiber," J. Opt. 20, 055501 (2018).
D. E. Mittelberger, R. D. Muir, M. Y. Hamamoto, M. A. Prantil, and J. E. Heebner, "Frequency-to-time optical arbitrary waveform generator," Opt. Lett. 44, 2863 (2019).
D. J. Moss, R. Morandotti, A. L. Gaeta, and M. Lipson, "New CMOS-compatible platforms based on silicon nitride and Hydex for nonlinear optics," Nat. Photonics 7, 597-607 (2013).
A. Mowla and N.Granpayeh, "Design of a flat-gain multipumped distributed fiber Raman amplifier by particle swarm optimization," J. Opt. Soc. Am. A 25, 3059-3066 (2008).
B. N. Nyushkov, S. M. Kobtsev, A. V. Ivanenko, and S. V. Smirnov, "Programmable optical waveform generation in a mode-locked gain-modulated SOA-fiber laser," J. Opt. Soc. Am. B 36, 3133 (2019).
Y. Park, M. H. Asghari, T.-J. Ahn, and J. Azaña, "Transform-limited picosecond pulse shaping based on temporal coherence synthesization," Opt. Express 15, 9584 (2007).
F. Parmigiani, C. Finot, K. Mukasa, M. Ibsen, M. A. Roelens, P. Petropoulos, and D. J. Richardson, "Ultra-flat SPM-broadened spectra in a highly nonlinear fiber using parabolic pulses formed in a fiber Bragg grating," Opt. Express 14, 7617 (2006).
F. Parmigiani, P. Petropoulos, M. Ibsen, P. J. Almeida, T. T. Ng, and D. J. Richardson, "Time domain add-drop multiplexing scheme enhanced using a saw-tooth pulse shaper," Opt. Express 17, 8362 (2009).
C. E. Preda, B. Ségard, and P. Glorieux, "Genetic drive of a laser," Opt. Lett. 29, 1885 (2004).
G. Pu, L. Yi, L. Zhang, and W. Hu, "Intelligent programmable mode-locked fiber laser with a human-like algorithm," Optica 6, 362 (2019).
G. Pu, L. Yi, L. Zhang, C. Luo, Z. Li, and W. Hu, "Intelligent control of mode-locked femtosecond pulses by time-stretch-assisted real-time spectral analysis," Light Sci. Appl. 9, (2020).
C. E. Rogers and P. L. Gould, "Nanosecond pulse shaping at 780 nm with fiber-based electro-optical modulators and a double-pass tapered amplifier," Opt. Express 24, 2596 (2016).
J. Schmidhuber, S. Hochreiter, and Y. Bengio, "Evaluating Benchmark Problems by Random Guessing," in A Field Guide to Dynamical Recurrent Networks, J. F. Kolen and S. C. Kremer, eds. (IEEE, 2009), pp. 1-12.
D. Simon, Evolutionary Optimization Algorithms (John Wiley & Sons, Inc., 2013).
B. Srivathsan, G. K. Gulati, A. Cerè, B. Chng, and C. Kurtsiefer, "Reversing the Temporal Envelope of a Heralded Single Photon using a Cavity," Phys. Rev. Lett. 113, 163601 (2014).
B. Stern, X. Ji, Y. Okawachi, A. L. Gaeta, and M. Lipson, "Battery-operated integrated frequency comb generator," Nature 562, 401-405 (2018).
Tang, Dingkang, Z. Jianguo, L. Yuanshan, and Z. Wei, "Ultrashort optical pulse monitoring using asynchronous optical sampling technique in highly nonlinear fiber," Chinese Opt. Lett. 8, 630-633 (2010).
S. Thomas, A. Malacarne, F. Fresi, L. Potì, and J. Azaña, "Fiber-based programmable picosecond optical pulse shaper," J. Light. Technol. 28, 1832-1843 (2010).
C. M. Valensise, A. Giuseppi, G. Cerullo, and D. Polli, "Deep reinforcement learning control of white-light continuum generation," Optica 8, 239 (2021).
M. Veli, D. Mengu, N. T. Yardimci, Y. Luo, J. Li, Y. Rivenson, M. Jarrahi, and A. Ozcan, "Terahertz pulse shaping using diffractive surfaces," Nat. Commun. 12, 37 (2021).
J. Wang, H. Shen, L. Fan, R. Wu, B. Niu, L. T. Varghese, Y. Xuan, D. E. Leaird, X. Wang, F. Gan, A. M. Weiner, and M. Qi, "Reconfigurable radio-frequency arbitrary waveforms synthesized in a silicon photonic chip," Nat. Commun. 6, 5957 (2015).
X. Wang, L. Zhou, R. Li, J. Xie, L. Lu, K. Wu, and J. Chen, "Continuously tunable ultra-thin silicon waveguide optical delay line," Optica 4, 507 (2017).
A. M. Weiner, D. E. Leaird, J. S. Patel, and J. R. Wullert, "Programmable Shaping of Femtosecond Optical Pulses by Use of 128-Element Liquid Crystal Phase Modulator," IEEE J. Quantum Electron. 28, 908-920 (1992).
A. M. Weiner, "Ultrafast optical pulse shaping: A tutorial review," Opt. Commun. 284, 3669-3692 (2011).
A. M. Weiner, "Femtosecond pulse shaping using spatial light modulators," Rev. Sci. Instrum. 71, 1929-1960 (2000).
B. Wetzel, M. Kues, P. Roztocki, C. Reimer, P. L. Godin, M. Rowley, B. E. Little, S. T. Chu, E. A. Viktorov, D. J. Moss, A. Pasquazi, M. Peccianti, and R. Morandotti, "Customizing supercontinuum generation via on-chip adaptive temporal pulse-splitting," Nat. Commun. 9, 4884 (2018.
R. I. Woodward and E. J. R. Kelleher, "Towards "smart lasers": Self-optimisation of an ultrafast pulse source using a genetic algorithm," Sci. Rep. 6, 1-9 (2016).
Y. Xie, L. Zhuang, and A. J. Lowery, "Picosecond optical pulse processing using a terahertz-bandwidth reconfigurable photonic integrated circuit," Nanophotonics 7, 837-852 (2018).
L. Yin, H. Wang, B. A. Reagan, and J. J. Rocca, "Programmable pulse synthesizer for the generation of Joule-level picosecond laser pulses of arbitrary shape," Opt. Express 27, 35325 (2019).
K. zhen Han, Y. Huang, F. fang Liu, X. Pang, P. Hu, G. wei Liu, H. Qin, F. Zhang, X. lu Ge, X. juan Liu, and X. Geng, "An intelligent method to design laser resonator with particle swarm optimization algorithm," Optoelectron. Lett. 14, 425-428 (2018).
J. Zhang, J. Cai, Y. Meng, and T. Meng, "Genetic algorithm particle swarm optimization based hardware evolution strategy," WSEAS Trans. Circuits Syst. 13, 274-283 (2014).

* cited by examiner

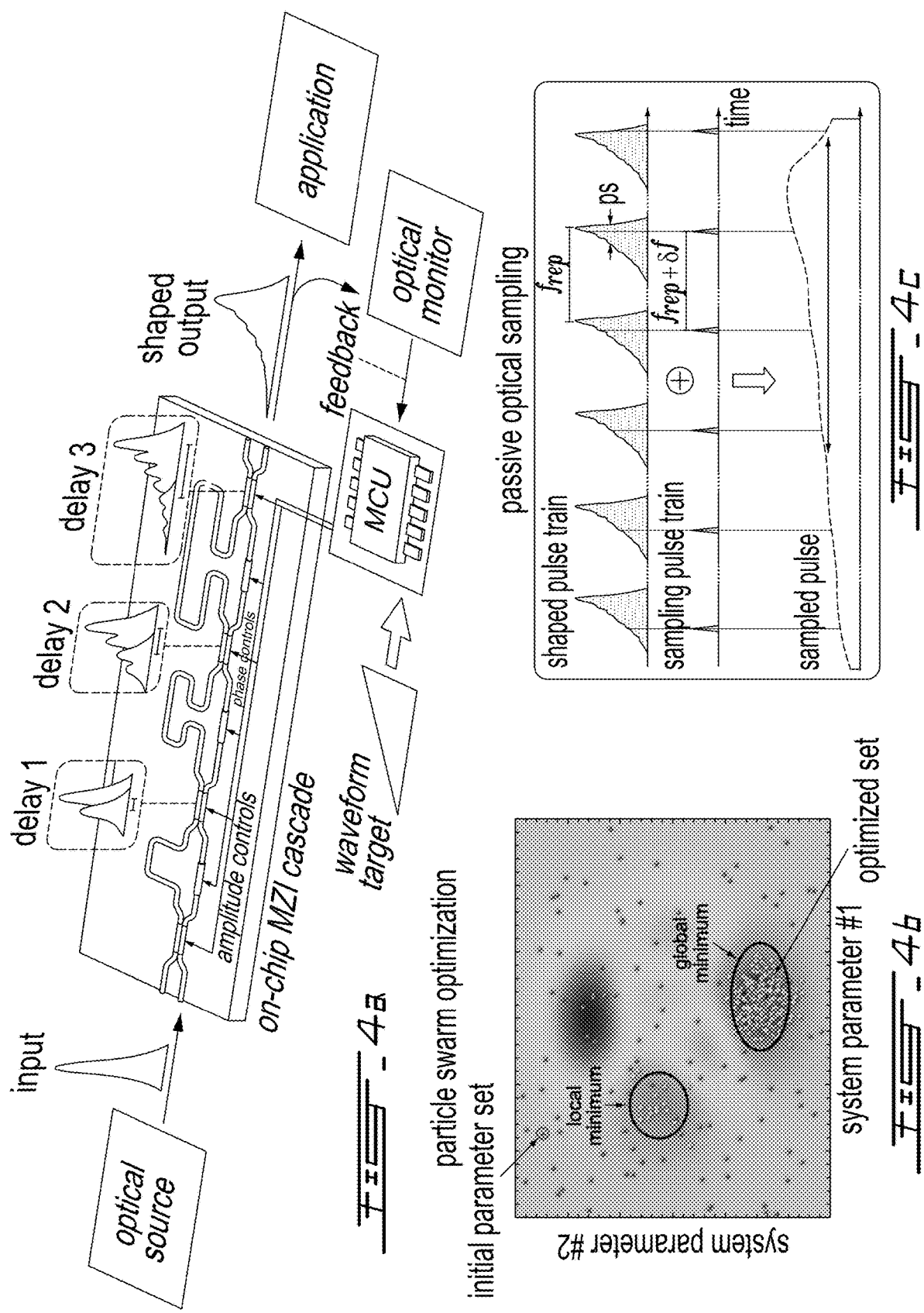

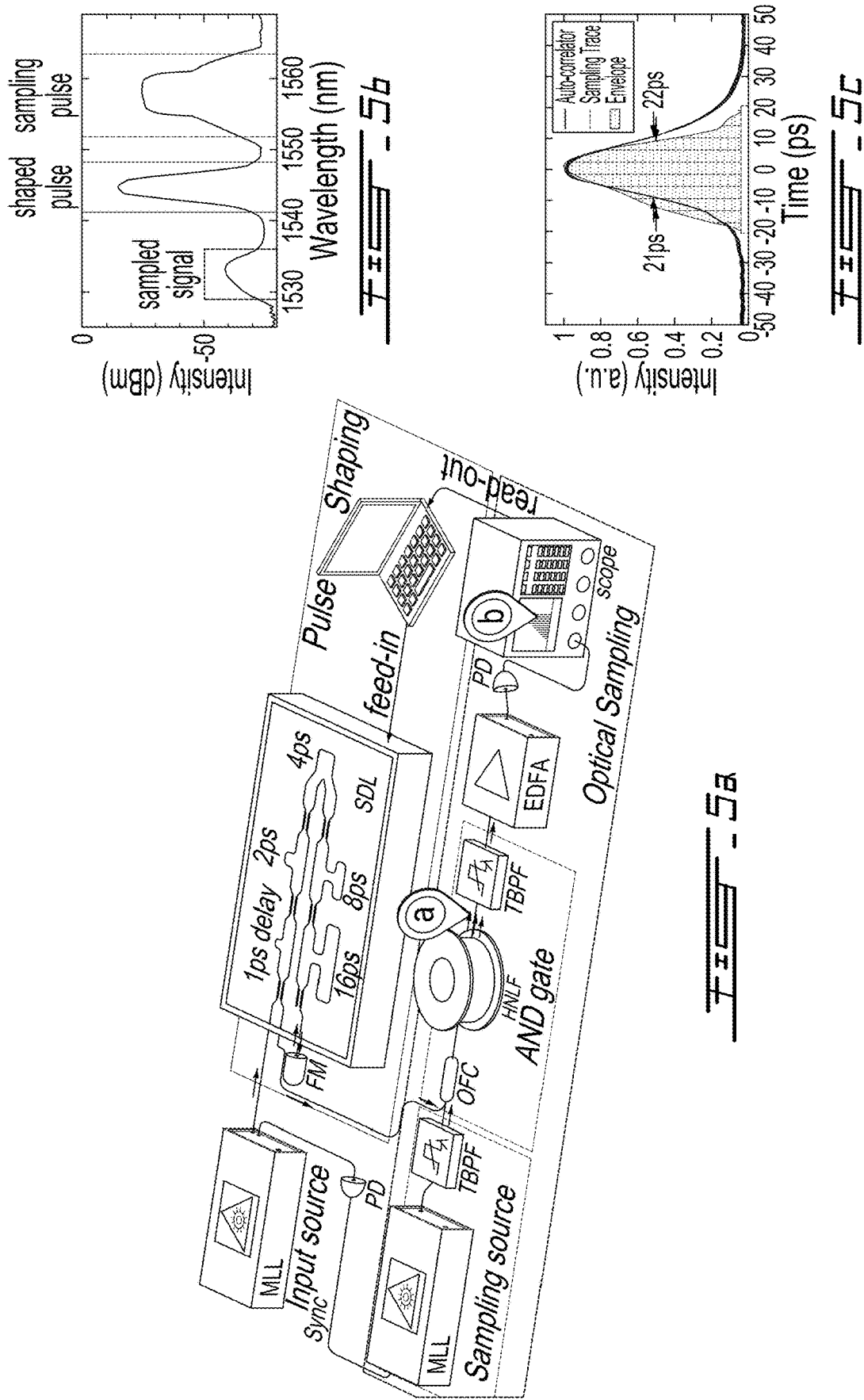

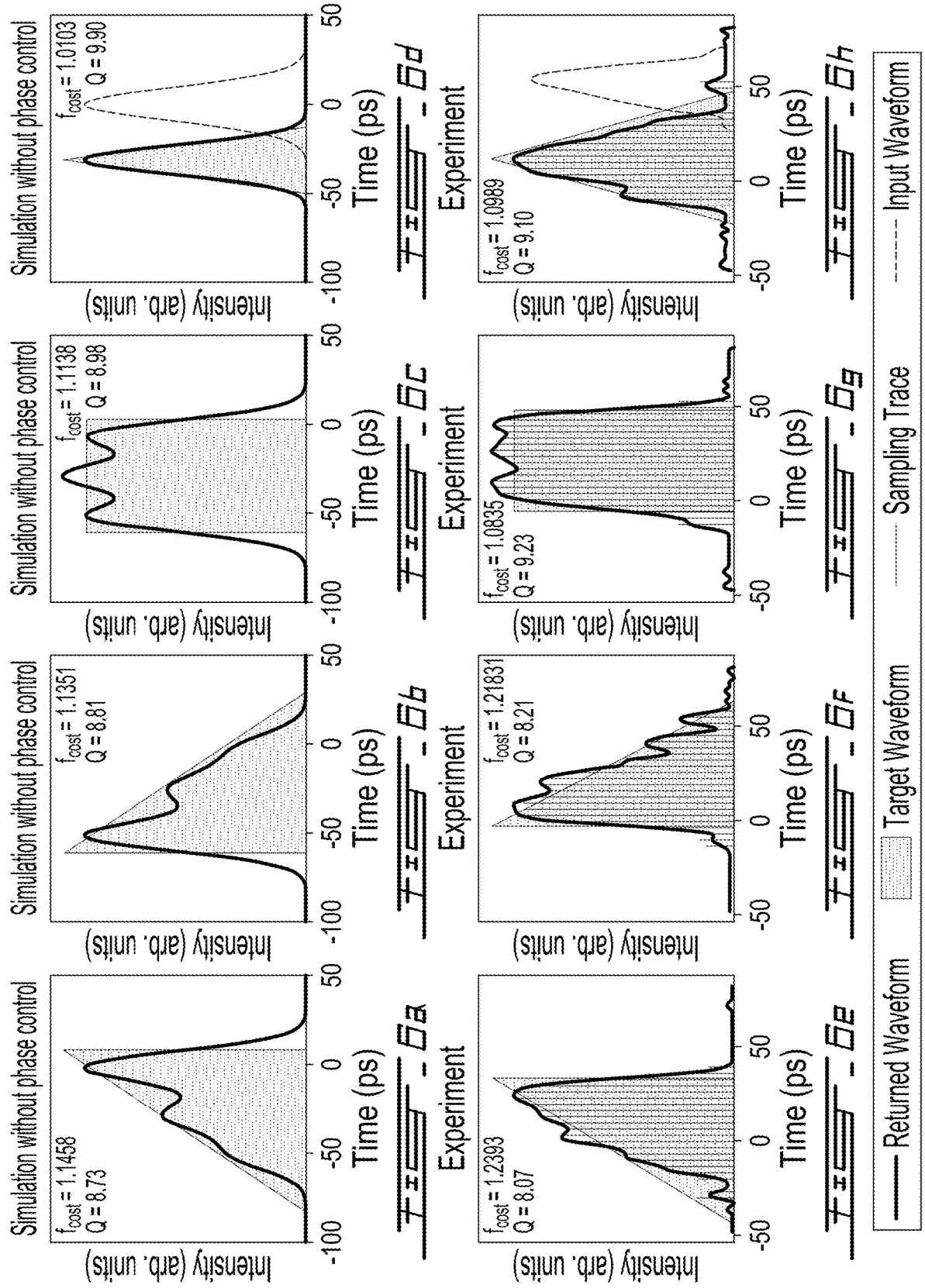

SYSTEM AND METHOD FOR ARBITRARY OPTICAL WAVEFORM GENERATION

CROSS REFERENCE TO RELATED APPLICATIONS

This application claims benefit of U.S. provisional application Ser. No. 63/201,378, filed on Apr. 27, 2021. All documents above are incorporated herein in their entirety by reference.

FIELD OF THE INVENTION

The present invention relates to temporal pulse shaping. More precisely, the present invention relates to a method and a system for arbitrary optical waveform generation.

BACKGROUND

Control over the temporal profile of optical signals is important in a number of application fields ranging from telecommunications, nonlinear and quantum optics, through to microwave photonics. However, shaping pulses of the order of tens to hundreds of picoseconds is particularly challenging, as known methods cannot be used for example for the implementation of efficient commonly nonlinear processes. Such methods include spectral shaping, which is capable of manipulating femto- to low picosecond pulses, typically shorter than about 10 ps pulses, by manipulating their broad optical spectrum via static amplitude or phase masks fabricated using lithography methods, or programmable manipulation using spatial light modulators. Longer optical pulses or signals, typically above about 1 ns, can be shaped with electro- and acousto-optic modulators driven by fast radio-frequency (RF) waveform generators.

Pulse durations in the range between 10 ps and 1 ns remain challenging due to the narrow linewidth of such signals. Important applications for pulses with durations in this range are, for communication and processing signals for example, more efficient nonlinear processes through the use of flattop-shaped pulses, while telecommunications applications can greatly benefit from sawtooth-shaped pulses for example. Other applications for temporally shaped pulses such as parabolic shaped pulses include for example supercontinuum generation, telecommunications.

A further challenge is added by applications requiring on-the-fly, adaptive temporal waveform generation, where the desired pulse shape and width are controlled in real-time. For providing arbitrary waveform control without the need for complex external characterization, inexpensive, namely commonly low-bandwidth electronics, of at most 1 GHz, unambiguous, and measurement methods are necessary to achieve real-time tunability. While picosecond pulses can be characterized using auto-correlators, such characterization is insufficient as it returns ambiguous results when measuring asymmetrical waveforms as many waveforms result in the same or very similar autocorrelation traces, making it impossible to distinguish between such pulses. While other optical measurement methods can resolve the issue of waveform ambiguity, such as FROG (frequency resolved optical gating) or SPIDER (spectral phase interferometry for direct electric-field reconstruction) for instance, based on characterizing the full complex optical phase, they usually rely on slow and complex algorithms for waveform retrieval.

Current methods for picosecond pulse shaping include the use of birefringent crystals, frequency-to-time mapping methods, the use of large amounts of dispersion in combination with active modulation, or the concatenation of free-space interferometers. Ongoing research is still under way.

Systems developed so far are bulky, utilize expensive GHz RF infrastructure, have high optical losses, typically 2-3 dB/cm for InP-based platform and 10 dB coupling losses, or are not flexible with input and output pulse durations, which is crucial for many telecommunications applications. Moreover, current systems and methods use pre-defined amplitude and phase settings determined from simulations on a digital computer and then transferred to the physical system, which limits the achievable accuracy, as the numerical simulations cannot account for all experimental effects, noise, and imperfections. Moreover, current systems and methods are commonly limited to a fixed set of waveforms, greatly limiting the application range thereof. Existing methods are typically very hard to integrate on-chip for on-the-fly shaping as they necessitate a continuous dynamic delay and broadband spectral detection.

There is still a need for a method and a system for arbitrary optical waveform generation.

SUMMARY OF THE INVENTION

More specifically, in accordance with the present invention, there is provided a system for arbitrary optical waveform generation from an optical input, comprising an optical shaper comprising unbalanced interferometers with at least one delay, the delay being selected of at least 0.1 ps; an optical sampling readout selected for measuring optical waveforms of at least 0.1 ps; and an electronic processing unit; wherein the optical input is a picosecond pulse; with a minimal pulse duration before the optical shaper equal to a minimal delay of the optical shaper; the optical shaper splitting and interfering optical pulses; the optical sampling readout collecting data at an output of the optical shaper; the electronic processing unit comparing the collected data with a preset target and updating the optical shaper from results of the comparison until a maximal match between the output of the optical shaper and the preset target output, wherein the maximal match is determined iteratively using one of: machine-learning, optimization algorithms and iterative search algorithms.

There is further provided a method for arbitrary optical waveform generation from an optical input from a laser source, comprising i) collection of data at an output of an optical shaper using an ultrafast all-optical readout; the optical readout comprising at least one of: all-optical sampling, time stretch and time lens; ii) comparison of the collected data with a predefined target output; iii) update of the optical shaper from results of the comparison; iv) repetition of steps i) to iii) until a maximal match between the output of the optical shaper and the preset target output, wherein the maximal match is determined iteratively using one of: machine-learning algorithms, metaheuristic optimization algorithms and iterative search algorithms.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 4A shows a principle of split-and-delay waveform generation based on temporal coherence synthesis in combination with all-optical monitoring and autonomous system parameter control;

FIG. 4B shows an example for parameter settings at the start and at the end of an smart optimization algorithm;

FIG. 4C shows asynchronous optical sampling;

FIG. 5A is a schematic view of a system for optical pulse shaping according to an embodiment of an aspect of the present disclosure;

FIG. 5B shows an example of an optical four-wave mixing spectrum after the highly nonlinear fiber (HNLF) of the system of FIG. 5A;

FIG. 5C shows the sampling characterization: sampled waveform from the oscilloscope after calibration (stippled lines), retrieved waveform from the sampling (grey area), and measured autocorrelation trace (solid line) using the system of FIG. 5A; and FIG. 6 show a comparison between simulation and experimental results after optimization, from left to right: positive sawtooth, negative sawtooth, flattop, triangle: FIGS. 6A-6D show simulation results with amplitude weighting only, similar to the experiment; FIGS. 6E-6H show experimental results from the temporal shaping using a system as in FIG. 5A and a particle swarm optimization (PSO) algorithm.

DESCRIPTION OF ILLUSTRATIVE EMBODIMENTS

The present invention is illustrated in further detail by the following non-limiting examples.

In a nutshell, there is generally presented a method and a system for compact, in-situ picosecond pulse shaping, for determining optimal system parameter settings to generate a target waveform in absence of a priori simulations. The method and system use temporal coherence synthesis by concatenated, on-chip, unbalanced interferometers as pulse splitters, with application-specific temporal delays between the arms of the interferometers.

Figure 1:
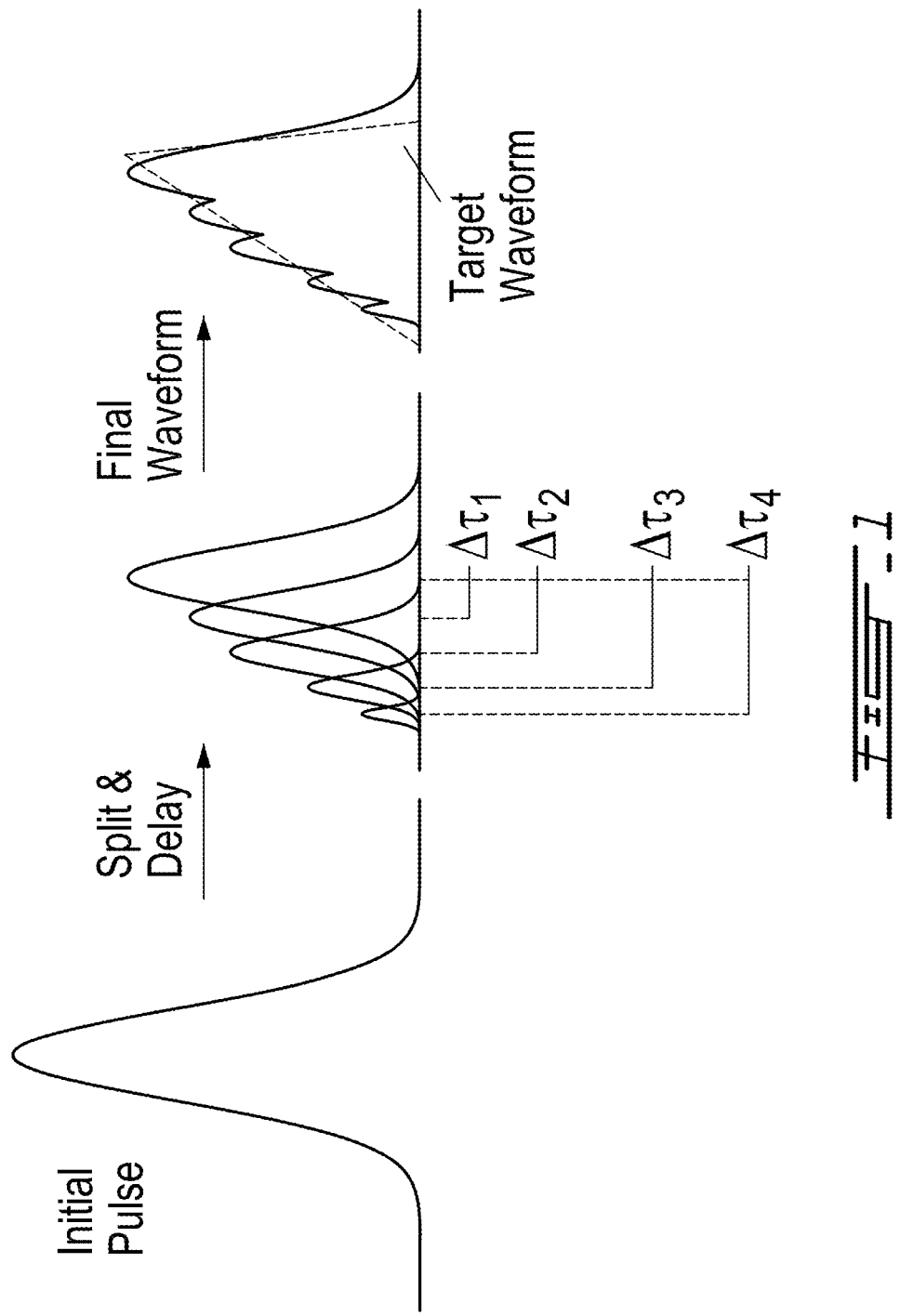
FIG. 1 shows is a schematical view of a method according to an embodiment of an aspect of the present disclosure.
Figure 2:
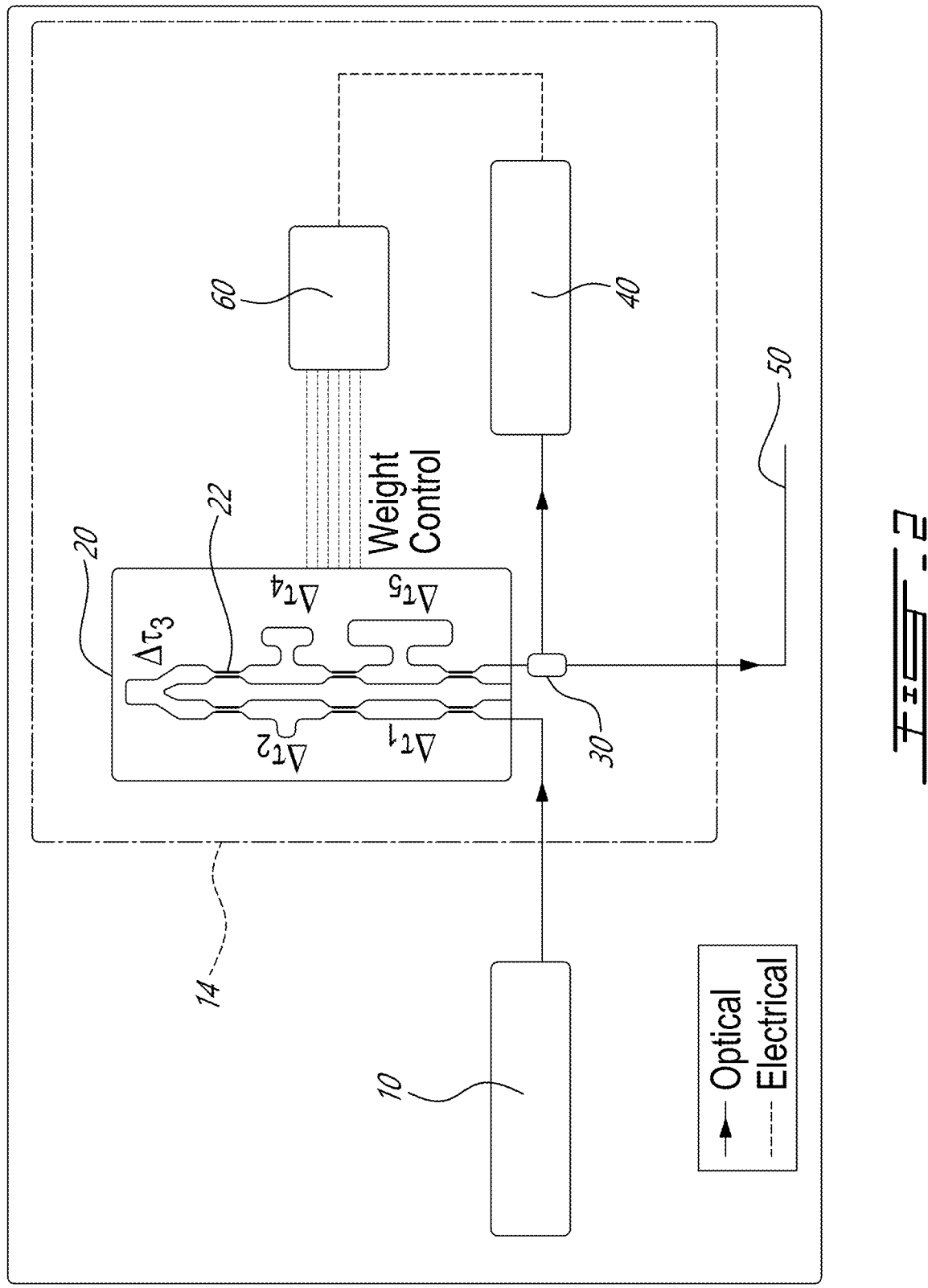
FIG. 2 is a schematical view of a system according to an embodiment of an aspect of the present disclosure.

According to an embodiment as shown in FIGS. 1 and 2, an initial input pulse from an optical source 10 is iteratively split in an optical pulse splitter 20 with a given split-ratio, i.e. with a given weighting. A first part of the pulse is delayed by while a second part of the pulse is not delayed. A target waveform is generated iteratively by weighted splitting of the first part of the pulse with successive delays $\Delta\tau l$, $l=1\ldots 4\ldots$, and recombination. The split-ratio of the pulse splitter refers to the fraction of light that is actually split off from the input light at the beam splitter of the interferometer and is strongly application dependent, normalized between 0, where all light remains in one path, and 1 when all light couples over to another path. The split-ratio of the pulse splitter is controlled using for example directional couplers with heater electrodes or balanced interferometers, to achieve full energy distribution created by the individual interferometer delays depending on the input and target output pulse duration. Each arm of the interferometers may comprise additional phase control of the propagating pulse, such as additional electrodes for example.

As shown in in FIG. 2, the initial input pulse is launched into a pulse shaping unit 14, for splitting and interfering by a pulse splitter 20, to generate a shaped pulse as output by coherence synthesis. The optical pulse shaper 20 is selected as a programmable optical pulse shaper, comprising a cascade of unbalanced interferometers with delays in the sub-picosecond range, typically 0.1 ps and larger, in the range between about 0.1 ps and about 1 ns. The initial input pulse is a picosecond pulse of a pulse duration of the order of the pulse delay Ar, in a range between 1 and 1000 ps. The minimal pulse duration of the initial picosecond pulse before the optical shaper 20 is selected as the minimal delay of the optical shaper 20.

Different combinations and interferometer configurations are possible. For example, the pulse splitter 20 may comprise individual phase control per delay arm 22, implemented by additional electrodes or materials such as phase change or epsilon-near-zero materials, which can be controlled using optical signals for example, to further improve the final waveform. The pulse splitting per delay is controlled using for example on-chip couplers, such as bi-directional, Y-branch design or multiport M×M couplers, M being an integer, which allows for 3-dimensional waveguide architectures further reducing the footprint of the system. The coupling weight may be controlled by thermo-optic effect using thermal heaters, the Pockels effect, or other optical phase control such as mechanical stress, all-optical nonlinear control (Kerr effect), opto-mechanical effects (thermo-striction), optical resonance detuning, or beam deflection. In FIG. 2, each individual output of the on-chip interferometer 20 is connected by thermally controllable beam splitters for ad-hoc adjustment of amplitude weights by a microcontroller unit (MCU) 60.

An ultrafast optical readout, in the form of all-optical sampling or time-stretch of single pulses or few pulses, is selected for measuring optical waveforms in the picosecond to nanosecond regime, in the range between about 1 ps and about 1 ns. In FIG. 2, after the pulse splitter 20, the first part of the shaped pulse, between about 5 and about 20% of the shaped pulse, is redirected by an optical coupler 30 and measured with an ultra-fast optical detection unit 40.

In an embodiment of an aspect of the present disclosure as illustrated for example in FIG. 5A, the optical detection unit 40 comprises an optical nonlinear medium, such as a highly nonlinear waveguide or semiconductor optical amplifier for example, and a sampling laser source of a pulse duration selected to be much smaller than the measured pulse duration of the optical source, typically by a factor between 5 and 1000. A fractional part of the shaped pulse from the optical coupler 30 enters the optical detection unit 40, where it may overlap temporally with the sampling laser inside the nonlinear optical element to perform optical sampling via a parametric nonlinear process, such as seeded four-wave mixing and cross-phase modulation for example. The source laser and the sampling laser may be selected with slightly different pulse repetition rates, typically between about 0.1 kHz and about 1 MHz difference, in asynchronous sampling, for example $f_{rep,1}$ and $f_{rep,2}=n \cdot f_{rep,1}+\Delta f$, where $\Delta f$ is small, below 1 MHz, and n is an integer, which results in discrete sampling of the shaped pulse by the sampling pulse. The output of the nonlinear medium is spectrally filtered, dependent on the nonlinear medium, and measured with a photodiode (see FIG. 5, the sampled signal is filtered (TBPF inside the 'AND' gate box)).

The sampling yields read-out signals that can be measured in real-time using low-bandwidth, typically kHz to <GHz, electronics such as photodiodes, analog-to-digital converters and operational amplifiers for example, and do not require extensive post-processing. Alternatively, time-lens or time-stretch methods which spread out the shaped pulse in time to allow measurement with lower bandwidth constraints may be used to unambiguously detect the shaped pulse with low-bandwidth electronics, although they may result harder to implement on-chip. In all cases, the measured waveform is digitally sampled and stored in the memory of a digital computer, such as a microcontroller, application-specific integrated circuit or field programmable gate array for example.

The measured waveform is then compared to a user-defined target waveform using an evaluation metric, such as mean square error (MSE), normalized MSE (NMSE), or cosine similarity for example, on the digital computer. The optimization then either maximizes or minimizes the evaluation metric, depending on whether a lower or higher evaluation value indicates better performance, in other terms, more closely resembles the target waveform. Based on the evaluation outcome, the weights of the pulse splitter device are adjusted in an electronic feedback loop by the present control method.

In FIGS. 1 and 2, five delays with amplitude weighting are shown for clarity. Any number of delays >1 may be used, depending on the material platform, i.e. optical losses, and input power. The delays can be implemented in different ways; for example, increasing or decreasing order ($\Delta\tau_1 < \Delta\tau_2 < \Delta\tau_3, \ldots$ or vice versa), with bit-wise increase or decrease, for example $2^n = \Delta\eta_1, 2 \times \Delta\tau_1, 4 \times \Delta\tau_1, \ldots$, identical delays ($\Delta\tau_1 = \Delta\tau_2 = \Delta\tau_3 = \ldots$), or a more arbitrary relation between subsequent delays depending on manufacturing constraints mainly, specifically, how much components one can place on a chip etc . . . . Alternatively, for increasing accessible delays and phases per delay, the on-chip pulse splitter 20 may be passed multiple times using for example, retro reflectors or Faraday mirrors at the output or multiple input and output ports.

Figure 3A:
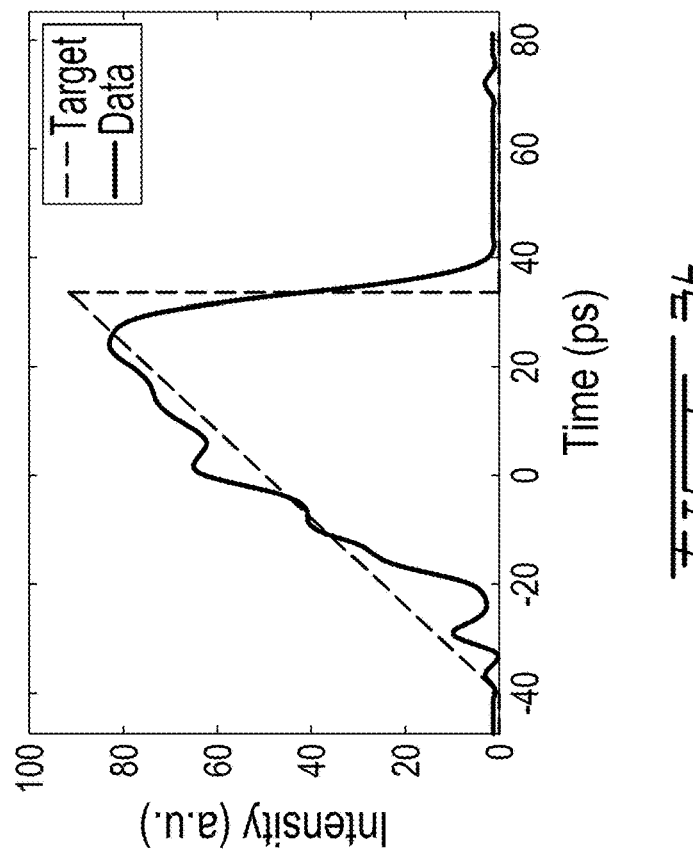
FIG. 3A shows experimental pulse shaping (full line) for a 59.5 ps square pulse and for a target pulse shape (dashed line), according to an embodiment of an aspect of the present disclosure.
Figure 3B:
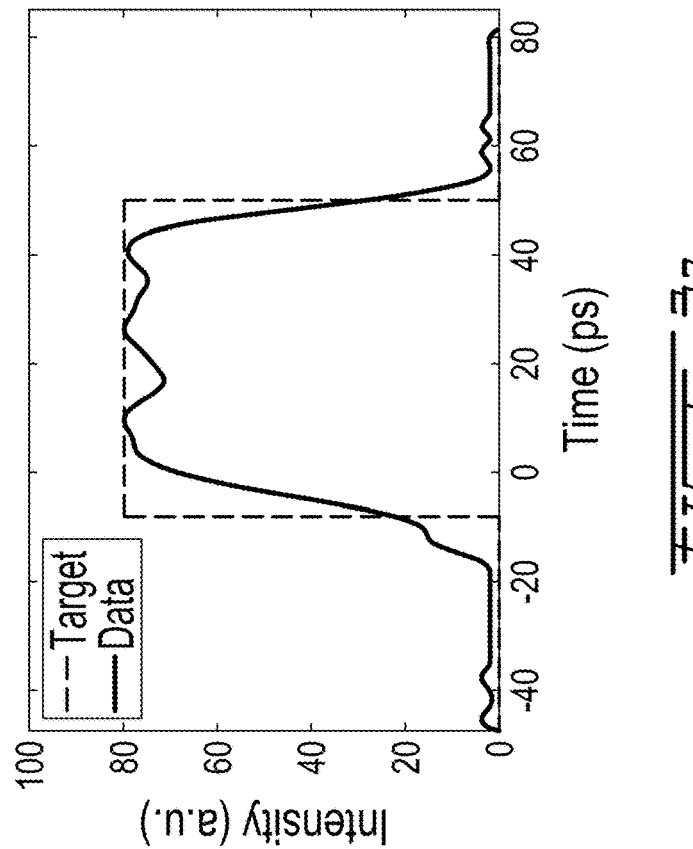
FIG. 3B shows experimental pulse shaping (full line) for a 52.4 ps sawtooth pulse and for a target pulse shape (dashed line), according to an embodiment of an aspect of the present disclosure.

FIG. 3 demonstrate picosecond shaped pulses according to an embodiment of the system and method, using a particle swarm optimization (PSO) in combination with all-optical sampling in asynchronous, i.e. pump and signal of different repetition rates, multi-integer (n=25) sampling configuration to generate different optical waveforms with several picosecond duration, in case of an input pulse duration of 22 ps.

The access to amplitude (phase) weights in the split-and-delay line (SDL) allows for autonomous tailoring of the output optical waveform to a target (see smart optimization in FIG. 4B). The system output is monitored making use of optical sampling which allows unambiguous detection of the optical envelope (see optical sampling in FIG. 4C). The measured waveform can then be compared to the target waveform while their deviation may be used to create an electronic feedback to adjust the amplitude (phase) weights of the split-and-delay line (SDL), as detailed hereinbelow.

The experimental system as shown in FIG. 5 comprises an input source (first mode-locked laser (MLL)), a sampling source synchronized with the input source by a photodiode (PD), an optical pulse shaping unit connected to the input source, a nonlinear optical AND gate, and an optical sampling unit.

The pulse shaping unit comprises a split-and-delay line (SDL) and a Faraday mirror (FM).

The system uses a commercial mode-locked fiber laser (Pritel FFL) as input source, emitting gaussian pulses with a duration i. e. full width at half maximum (FWHM) of $\Delta\tau_{FWHM,1} \approx 22$ ps at a repetition rate of $f_{rep,1} = 10$ MHz, centered at 1544.6 nm. The pulse processing is performed by the integrated on-chip pulse-splitter embodied by the split-and-delay line (SDL). In order to increase accessible delay combinations, the pulse propagates through the split-and-delay line (SDL) twice, after the pulse exits the split-and-delay line (SDL) being reflected on the fiber mirror (Faraday mirror (FM)) and propagating backwards through the chip again.

Waveform sampling is realized through the nonlinear optical AND gate. The AND gate is based on seeded, degenerate four-wave mixing (FWM) in a highly nonlinear fiber (HNLF), OFS Fitel Denmark ApS., 1 km length, 1546 nm zero-dispersion wavelength). A second mode-locked fiber laser (Menlo FC1500-250-WG, $f_{rep,2} = 250.27$ MHz, $\Delta\tau_{FWHM,2} = 4.4$ ps after spectral filtering at 1557.9 nm±2.4 nm) with a slightly different repetition rate than the pulse shaper (i.e., $f_{rep,2} = nf_{rep,1} + \delta f$) is used as the sampling probe. Both optical sources are coupled to the highly nonlinear fiber (HNLF) and undergo phase-matched parametric amplification at times when they temporally overlap. By using locked, but asynchronous repetition rates, the seed (sampling) pulse passively scans over the full duration of the (shaped) pump pulse at relatively slow repetition with sampling period $\Delta T = 1/\delta f = 3.7$ μs. As a result, an optical idler is generated at very specific sampling times at another frequency band. This band is spectrally filtered using a tunable optical tunable bandpass filter (TBPF) (Finisar Waveshaper, 1532.4 nm±3.8 nm), slightly amplified and directed to a fiber coupled photodiode (see erbium-doped fiber amplifier (EDFA)). (Finisar XPDV2120R). A real-time oscilloscope (Agilent DSO-X 92804A) is used for interfacing and automatic readout of the photodiode signal. Finally, a numerical Hilbert transform is used to extract the envelope of the sampled signal. For additional read-out stability, both lasers are locked to each other, i.e., the input source is used as external reference to lock the repetition rate of the sampling source, to minimize effects caused by any cavity drifts during the experiment, which allows for reliable and constant spacing $\Delta T$ of the sampling points over several weeks.

The μs sampling period is calibrated to the picosecond scale by accurately measuring the repetition rate difference of the input laser and the sampling laser. The calibration factor is confirmed by performing an autocorrelation measurement of the unshaped Gaussian pump pulse. The autocorrelation width ($\Delta\tau_{FWHM,1,AC} = 21.85$ ps) matches the measured envelope width of the optical sampling scope considerably well ($\Delta\tau_{FWHM,1,Sample} = 21.26$ ps) (FIG. 5C). A slight asymmetry between the retrieved sampling pulse and the symmetric autocorrelation originates from the dispersion of the long highly nonlinear fiber (HNLF). Highly nonlinear on-chip waveguides or shorter highly nonlinear fibers can be used to avoid this problem.

The asynchronous sampling method features a few benefits for the measurement of narrowband output pulses. First, the low-repetition idler can be detected with much lower equipment constraints compared to other ultra-fast measuring schemes. Especially dispersive time-stretch methods, for example dispersive Fourier transform, are not very effective for pulse widths greater than 10 ps as highly dispersive elements are required to achieve tens of nanosecond duration that is resolvable with ultrafast photodiodes. Otherwise, direct optical detection methods, for example ultrafast >100 GHz photodetection, are very expensive and still limited in temporal resolution even when considering state-of-the-art 100 GHz bandwidth optoelectronics. Second, the idler power $P_i$ is directly proportional to the pump power $P_p$ squared, with $P_i(t) \sim \gamma^2 P_s(\tau) P_p^2(t-\tau)$, with seed power $P_s$, nonlinear parameter $\gamma$, and the temporal delay $\tau$ between pump and seed. This proportionality allows for the authentic detection of the waveform square. Such detection is particularly crucial for measuring non-gaussian pulses such as triangular, square or sawtooth waveforms, which all yield a triangular autocorrelation with barely distinguishable features. Third, the overall sampling time span is simply limited by the fastest repetition rate in the system, here the 4 ns repetition period of the sampling laser. Hence, optical nonlinear sampling provides picosecond resolution over nanosecond long time spans and yields conclusive waveforms that are easy to read-out for slow electronics, ultimately offering the potential for full-system integrable read-out and feed-back electronics.

Data evaluation is performed on an electronic processing unit (for example, microcontroller unit 60 in FIG. 2). The processing unit compares the measured system output with the targeted system output previously defined by the system user.

From the evaluation results, the processing unit 60 gives feedback to the optical shaper system to update the control values and weight controls, by an update in on-chip heater currents, update on path delay of free-space mirrors, update on micro-electromechanical systems (MEMS). The measure-and-update procedure is repeated until maximal match between shaper system output and target is achieved (FIG. 3). The optimal feedback, i.e. maximal match, is found iteratively using machine-learning algorithms (e.g., reinforcement learning), metaheuristic optimization algorithms such as genetic algorithm (GA), particle swarm optimization (PSO) or iterative search algorithms.

The optically sampled waveform was used to autonomously optimize the arbitrary optical waveform generation output using an evolutionary algorithm. Commonly, generic algorithms are used to perform a smart search for the most performant system parameters with respect to minimizing a given error or cost function. The performance of generic algorithms grows with a reasonable guess of initial parameters, which cannot always be found for systems with many degrees of freedom at adequate resources, for example time or computational power. Other algorithms may therefore be needed to efficiently converge a complex system state.

For the implementation of the adaptive optical pulse shaping, two standard optimization algorithms were used to determine the best system settings, namely the voltages for each thermal switch. Both algorithms, particle swarm optimization (PSO) and generic algorithm (GA), are nature-inspired, population-based, metaheuristic optimization algorithms. Both start with an initial population (i.e., swarm of size M) of system parameters (particles) in a N-dimensional search space (i.e., N is the number of variables per particle to optimize) and minimizes the particle potential in this space given by a cost function, as illustrated in FIG. 4.

In the experiment, a swarm size of M=60 with N=6 parameters each was used. Each particle in the swarm represents a set of 6 voltage values for the electrodes that control the transitions, namely amplitude splitting ratios, to 5 Mach-Zehnder interferometers (MZIs). In order to speed up the optimization progress, the maximum possible iterations were reduced to 60 and the stall iterations, namely the number of iterations after which the algorithm stops when not improving, to 12. Other parameters were used with the default values (e.g. for the PSO: self- and social adjustment weights at 1.49, inertia range between 0.1 and 1.1).

The smart optimization or machine learning performance critically relies on the selection of a meaningful cost function $f_{Cost}$. The cosine similarity $\cos(\theta)$ was used as base of the cost function $f_{Cost}$, which is a measure of similarity between two vectors, A and B, defined as follows:

$$f_{Cost} = 1 - \cos\theta = 1 - \frac{A \cdot B}{\|A\|\|B\|} = 1 - \frac{\sum_{i=1}^{n} A_i B_i}{\sqrt{\sum_{i=1}^{n} A_i^2} \sqrt{\sum_{i=1}^{n} B_i^2}} \quad (1)$$

with $A_i$ and $B_i$ being the discrete time samples of the target and measured waveforms, respectively. The cosine similarity ranges from −1 (inverted similarity) to +1 (complete similarity) with 0 meaning absence of correlation between both vectors. By subtracting the cost function from unity: 1−cos θ, the cost function features a global minimum only for complete similarity and thus allows the use of optimization algorithms such as the particle swarm optimization (PSO). In order to increase the sensitivity, the cost function as a power of ten, $10^{f_{cost}}$, was further used. In this case, the cost function features a minimum at 1 (complete similarity), while uncorrelation and dissimilarity yield a value of 10 to 100, respectively. Yet, it becomes apparent that each optimization finished with a value below 3, necessitating the introduction of another benchmark value to further discriminate between and compare the optimization results. Here, a Q factor is defined by $Q = \text{sgn}(\cos\theta) \cdot 10^{|\cos\theta|}$ that reaches 10 in case of perfect similarity, 0 in case of missing correlation and −10 in case of dissimilarity.

In order to demonstrate the capabilities of the present pulse shaping method, four waveforms of particular interest for optical signal processing were tested: positive and negative sawtooth, triangle and flattop pulses. Each waveform optimization in the laboratory finished within 5 hours, namely 60 particles×60 iterations×5 s for the split-and-delay line (SDL) reprogramming and waveform measurement, while the simulations finished in less than 5 minutes.

Figures 6I, 6J, 6K, 6L:
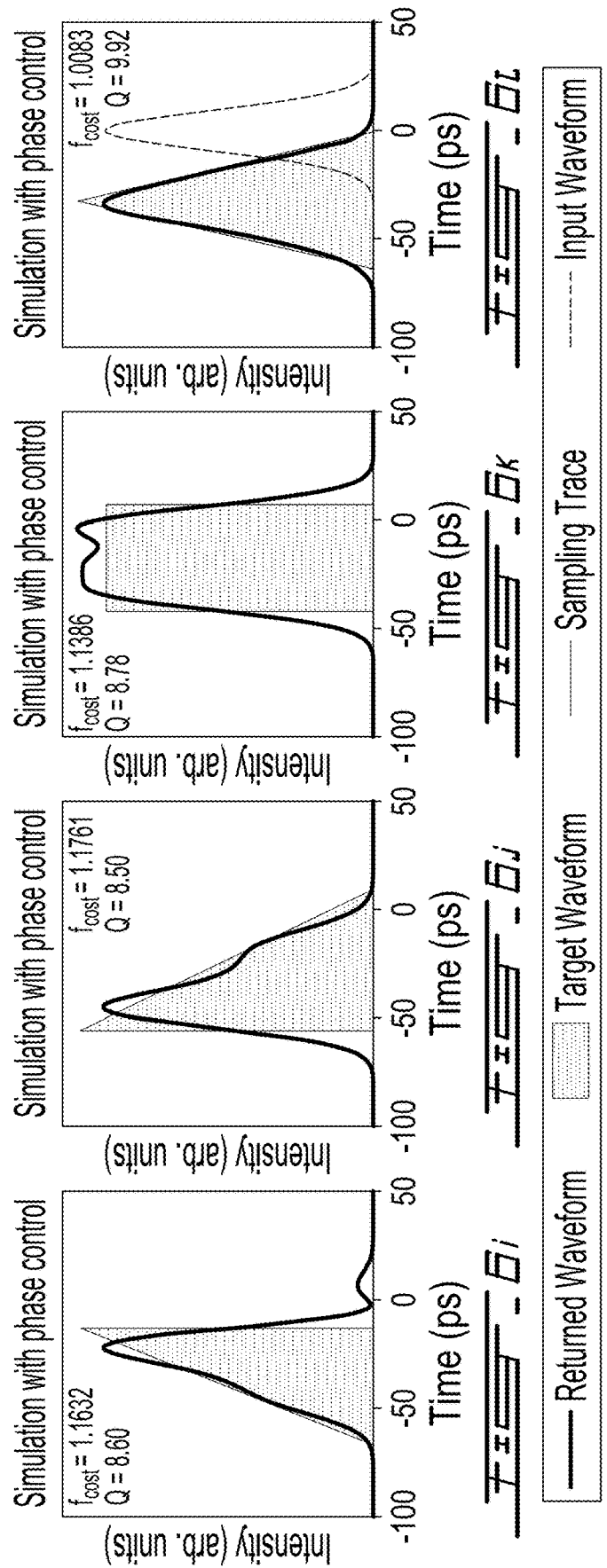
FIGS. 6I-6L show simulation results with both amplitude and phase control per delay; the input waveforms (dashed line) for FIG. 6D, FIG. 6H and FIG. 6I being scaled in amplitude for visibility and comparability, the time axes are equal between input and output waveforms.

FIG. 6 show the results for both experiment and simulation in case of an input pulse with 21 ps duration: The top row (FIGS. 6A-6D) shows the simulation results for optimizing only the amplitude ratios of the switches, similar to the experimental configuration, the middle row (FIGS. 6E-6H) shows the experimental results, and the bottom row (FIGS. 6I-6L) shows the results for an ideal configuration where amplitude and phase settings for each delay can be optimized. In all cases, an ideal waveform shape was targeted, regardless of the full width at half maximum (FWHM) width of the output. Thus, the algorithm finds the waveform with the lowest cost function value, corresponding to the best overlap with a given waveform shape.

The experimental data (FIGS. 6E-6H) demonstrate that, by incorporating the delays from the 5 interferometers, an output pulse duration (full width at half maximum (FWHM) width) greater than 45 ps can be achieved (see also FIG. 8 for more details). Both simulated and measured results (FIGS. 6A-6H) match the targeted waveforms considerably well in all cases, despite the arbitrary phase settings on each delay and amplitude control only. Improvements on the smoothness of the waveforms can be achieved by adding individual phase control per delay arm, as demonstrated in the simulation results in FIGS. 6I-6L. Nevertheless, amplitude-only temporal processing on each delay performs surprisingly well. Notably, in some cases, no shaping occurs if no pulse width is targeted, for example FIG. 6D, which is a result of missing sensitivity of the cost function to small deviations between target and waveform, and this despite the use of a power to ten of $f_{cost}$t already.

In conclusion, picosecond pulse shaping by temporal coherence synthesis on a fiber-coupled, reconfigurable split-and-delay line chip combined with a cost-effective optical readout and an autonomous optimization method is demonstrated. The demonstrated system can achieve arbitrary optical pulse forms of several tens of picoseconds with on-the-fly reconfigurability using a potentially chip-integrable pulse sampling scheme. Notably, pulse form generation at pulse durations in the range between about 1 and about 100 ps, as targeted herein, is currently not achievable with any commercial device. The system features low energy consumption of maximum 1.8 W during operation (about 300 mW per switch for the largest voltage applied; optical monitoring and software-based optimization excluded), mainly from the current that is required to hold the correct splitting weights. Contrary to other on-chip approaches, no high-speed detection equipment or a priori simulations for weight determination are mandatory for the present approach. Additional phase control on each delay arm may be used to the expense of system complexity and a complete on-chip system integration, using for example soliton microcombs as shaping and sampling source and a spiral waveguide for the optical sampling.

The present disclosure presents miniaturizing the components necessary for temporal coherence synthesis onto a single CMOS-compatible high-index silica chip, using a concatenation of up to 5 unbalanced Mach-Zehnder interferometers (UMZI) with bit-wise increasing delays $\Delta t_n = 2n^{-1}$, ranging from $\Delta t_1 = 1$ ps to $\Delta t_6 = 16$ ps, in a compact footprint (11.75×9.00 mm²), as illustrated in FIG. 5. The platform offers formidable transmission efficiencies, compared to other materials, since high-index silica waveguides (refractive index of 1.7 and 1.45×1.5 μm² in cross-section) feature ultra-low propagation losses (linear loss <0.06 dB/cm at 1550 nm) and low coupling losses to standard SMF28 fibers (1.4 dB insertion loss per facet). Each individual on-chip interferometer output is connected by thermally controllable beam splitters for ad-hoc adjustment of amplitude weights (<100 ms switching time), which can be directly addressed through the microcontroller unit (MCU). At each interferometer stage, the incoming optical field is split with a specific ratio by thermally tuning the waveguide coupler at input, mediated by the microcontroller unit (MCU). One copy of the split pulse then propagates through the delay, while the other part propagates a fixed short path (about 1 ps delay). Afterwards, the two pulses interfere in another controllable waveguide coupler and create a new temporal waveform. A particular advantage of cascading Mach-Zehnder interferometers (MZIs) is that optical energy does leave the coupled waveguide system until the optical pulse reaches the last coupler. Hence, the device loss, and thus the energetic efficiency, is determined by the coupling coefficients of the last coupler in the system. It is important to note that the presented platform does not provide phase control on the individual delays. The implications of that on the device performance is discussed in detail hereinbelow.

The use of silica-based platforms for the pulse splitter 20 allows for low-loss propagation, of about 0.06 dB/cm for SiN platforms compared to between about 2 and about 3 dB/cm in existing InP platforms for example, enabling larger delays, and hence a wide coverage of target pulse widths, in the range between about 10 s and about 100 s of picoseconds in a mass-producible, complementary metal—oxide—semiconductor (CMOS) compatible format.

Moreover, in absence of a priori designs, the present method allows tolerances to system imperfections and a reduced need for system characterization/modelling. A combination with simulations may be contemplated for further performance enhancements. The use of an in-line, all-optical unambiguous measurement method allows arbitrary output pulse forms, asymmetric, symmetric, etc . . . , addressable in-situ. Fast convergence is achieved compared to parametric approaches or random search methods by selecting metaheuristic optimization.

The present disclose thus presents a method and a system combining pulse shaping, either in free space, with fiber, or on chip, ultrafast optical readout, such as optical sampling, and metaheuristic optimization for obtaining optimal parameters. The optimal parameters, maximal match as described hereinabove, are found iteratively using machine-learning algorithms, such as reinforcement learning, metaheuristic optimization algorithms such as genetic algorithm (GA), particle swarm optimization (PSO) or iterative search algorithms. Versatile, unambiguous optical pulse shaping is achieved, with a compact footprint in case of on-chip implementation.

The present system and method for picosecond pulse shaping combines temporal coherence synthesis with a self-adaptive control method using only low-bandwidth, typically below GHz, and cost-effective electronics. The system, comprising a pulse splitter, nonlinear waveguide, filter and photodiode, may be integrated on a robust and compact photonic chip, for mass fabrication and fast distribution into the telecommunications market.

Furthermore, by obtaining the optimal parameters using metaheuristic optimization, reduced vulnerability to system imperfections is achieved, in absence of a priori simulation results. The method may be used in combination with a priori methods to accelerate training times for example, hence allowing an application-tailored, wide-range of target waveforms and pulse durations. Thus, the present method allows for arbitrary waveform generation providing enough variables are available, such as additional phase control on the arms for example, thus offering high versatility in a compact system.

The present on-chip device may be combined with an ultra-fast optical measurement system and a global metaheuristic optimization system, such as particle swarm optimization (PSO) or genetic system, such as interactive genetic system (IGA) for example, in order to determine the correct device settings, that is the splitting ratios of the pulse splitter or phases. Particle swarm optimization (PSO) is used herein for illustration as smart optimization; other smart optimization may use genetic algorithms. Machine learning algorithms such reinforcement learning or gradient descent may be used.

The scope of the claims should not be limited by the embodiments set forth in the examples, but should be given the broadest interpretation consistent with the description as a whole.

The invention claimed is:

1. A method for arbitrary optical waveform generation from an optical input from a laser source, comprising:

i) collection of data at an output of an optical shaper using an all-optical readout; said optical readout comprising at least one of: all-optical sampling, time stretch and time lens;

ii) comparison of the collected data with a predefined target output;

iii) update of the optical shaper from results of said comparison;

iv) repetition of steps i) to iii) until a maximal match between the output of the optical shaper and a preset target output, wherein the maximal match is determined iteratively using one of: machine-learning algorithms, metaheuristic optimization algorithms and iterative search algorithms;

wherein the optical shaper has at least one delay of at least 0.1 ps.

2. The method of claim 1, wherein the optical input is a picosecond pulse; with a minimal pulse duration before the optical shaper equal to a minimal delay of the optical shaper; the optical shaper splitting and interfering optical pulses.

3. The method of claim 1, wherein the optical input is a picosecond pulse; with a minimal pulse duration before the optical shaper equal to a minimal delay of the optical shaper; the optical shaper comprises unbalanced interferometers with at least one delay, and the optical readout is selected for measuring optical waveforms of at least 0.1 ps.

4. The method of claim 1, wherein the optical input is a picosecond pulse; with a minimal pulse duration before the optical shaper equal to a minimal delay of the optical shaper; the optical shaper comprises a cascade of unbalanced interferometers with at least one delay, and the optical readout is selected for measuring optical waveforms of at least 0.1 ps.

5. The method of claim 1, wherein the optical input is a picosecond pulse; with a minimal pulse duration before the optical shaper equal to a minimal delay of the optical shaper; the optical shaper comprises unbalanced interferometers with at least one delay, the delay being selected is selected in a range between 0.1 ps and 1 ns, and the optical readout is selected for measuring optical waveforms of at least 0.1 ps.

6. The method of claim 1, wherein the optical input is a picosecond pulse; with a minimal pulse duration before the optical shaper equal to a minimal delay of the optical shaper; the optical shaper comprises a cascade of unbalanced interferometers, with a plurality of delays, in a range between 0.1 ps and 1 ns.

7. The method of claim 1, wherein the optical shaper comprises a cascade of unbalanced interferometers with at least one delay in a range between 0.1 ps and 1 ns, the method comprising controlling a pulse splitting per delay.

8. The method of claim 1, comprising optical sampling using a pulsed laser source, an optical coupler and an optical nonlinear medium, the laser source emitting pulses of a pulse duration smaller than a measured duration of an output pulse of the optical shaper by a factor of at least 5 to perform an optical sampling, the optical coupler directing a first part comprised in a range between 5 and 20% of the output of the optical shaper to the optical sampling readout, the optical nonlinear medium combining a second part of the output of the optical shaper with the sampling source.

9. The method of claim 1, comprising selecting the optical readout to perform one of: all-optical sampling, time-stretch of single pulses and time-stretch of more than one pulse.

* * * * *